United States Patent
Mahanpour

(10) Patent No.: US 6,181,153 B1
(45) Date of Patent: Jan. 30, 2001

(54) METHOD AND SYSTEM FOR DETECTING FAULTS IN A FLIP-CHIP PACKAGE

(75) Inventor: Mehrdad Mahanpour, Union City, CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/225,174

(22) Filed: Jan. 4, 1999

(51) Int. Cl.[7] .................................................. G01R 31/00
(52) U.S. Cl. ...................... 324/765; 324/766; 324/769; 324/501
(58) Field of Search ................................ 324/158.1, 765, 324/501, 769, 764, 766

(56) References Cited

U.S. PATENT DOCUMENTS

| | | | |
|---|---|---|---|
| 3,665,307 | * 5/1972 | Cocca | 324/158.1 |
| 3,934,199 | * 1/1976 | Channin | 324/158.1 |
| 4,514,436 | 4/1985 | Moerschel | 427/10 |
| 5,394,101 | * 2/1995 | Mitros | 324/769 |
| 5,422,498 | 6/1995 | Nikawa et al. | 257/48 |
| 5,757,193 | * 5/1998 | Yu et al. | 324/501 |
| 5,913,103 | 6/1999 | Chen | 438/14 |
| 5,963,040 | 10/1999 | Liu | 324/551 |

OTHER PUBLICATIONS

Ferrier, S., "Thermal and Optical Enhancements to Liquid Crystal Hot Spot Detection Methods," Hewlett–Packard Company, pp. 57–62.

Dictionary: fats and oils; Epicurious Dictionary; http://epicurious.com/db/dictionary/terms/f/fats_and.html.

Peanut Oil Experiment; Experient; Solubility and the Percent of Oil in Peanuts http://www.woodrow.org/teachers/chemistry/institutes/1988/peanutlab.html.

MSDS Direct Drive Oil; HYVAC Products, Inc.; Material Safety Data Sheet; http://www.hyvac.com/dd_msds.htm.

Peanut oil 5% in aqueous cream; Material Safety Data Sheet; Orion Laboratories Pty Ltd; http://www.orion.net.au/pea01474_1_msds.html.

Dictionary; peanut oil; Epicurious Dictionary; http://epicurious.com/db/dictionary/terms/p/peanut_o.html.

Re: Peanut vs. Peanut Oil for Type A's; http://www.dad-amo.com/forum/board2/messages/651.html.

"Thermal and Optical Enhancement to Liquid Crystal Hot Spot Detection Methods," S. Ferrier.

* cited by examiner

*Primary Examiner*—Safet Metjahic
*Assistant Examiner*—Jimmy Nguyen
(74) *Attorney, Agent, or Firm*—Sawyer Law Group LLP

(57) ABSTRACT

A system and method for detecting a fault in a circuit of a semiconductor package is disclosed. The semiconductor package includes a die having an active area and a substrate. The circuit is located on the active area of the die. The method and system include applying a liquid having a relatively low smoke point and which moves readily with respect to the semiconductor die to a surface of the semiconductor die. The liquid forms a thin layer on the exposed surface of the semiconductor die. The method and system further include applying power to the circuit and determining where a portion of the liquid has moved away from an exposed portion of the surface of the die.

12 Claims, 4 Drawing Sheets

METHOD AND SYSTEM FOR DETECTING FAULTS IN A FLIP-CHIP PACKAGE

FIELD OF THE INVENTION

The present invention relates to detection of faults in semiconductor devices and more particularly to a method and system for allowing detection of faults in a flip-chip package without destroying the circuitry on a semiconductor die in the flip-chip package.

BACKGROUND OF THE INVENTION

Semiconductor dies typically include an active area having circuits formed therein. After fabrication of circuits on a semiconductor die, detection of faults is often desirable. Detecting these faults without destroying the circuitry on the semiconductor is also useful. Because the circuits were preserved during fault detection, the circuits can also undergo other non-destructive testing prior to deprocessing. Once the position of the fault is detected and other testing completed, the circuits may be deprocessed in order to determine the exact nature of the fault or to farther investigate the properties of the circuit.

Conventional semiconductor dies are mounted on a substrate to form semiconductor packages. In conventional packages, the die is mounted with the active area up, away from the substrate. In flip-chip packages, the die is mounted with the active area down, in proximity to the substrate. In either case, it is desirable to detect faults in the circuits in the active area.

Certain faults in the circuits, such as shorts, generate heat. In order to detect faults which cause hot spots, liquid crystals are conventionally used. For a conventional package, a thin layer of liquid crystal is poured over the circuits at the top of the die. For a flip-chip package, the back of the die is thinned, then a thin layer of liquid crystal is poured over the surface of the back of the die. Power is then provided to the circuits on the die. The liquid crystal changes phase over any hot spots in the circuits. Consequently, the liquid crystal appears to change color over these hot spots in the circuit. Alternatively, the liquid crystal moves away from the hot spots, leaving an exposed area of the die. These hot spots and, therefore, areas where the liquid crystal appears to have changed color mark the position of certain faults in the circuits. Consequently, the position of faults in the circuit can be detected.

Although conventional liquid crystal detection functions for circuits in conventional packages, the use of liquid crystal has several drawbacks. Liquid crystal is relatively expensive. Liquid crystal is also hazardous to the health of a user. In addition, the conventional method for using liquid crystal to detect faults may be relatively difficult to perform.

Accordingly, what is needed is a system and method for detecting faults in circuits on conventional packages and in particular flip-chip packages without destroying the circuits. The present invention addresses such a need.

SUMMARY OF THE INVENTION

The present invention provides a system and method for detecting a fault in a circuit of a semiconductor package. The semiconductor package includes a die having an active area and a substrate. The circuit is located on the active area of the die. The method and system comprise applying a liquid having a relatively low smoke point and which moves readily with respect to the semiconductor die to a surface of the semiconductor die. The liquid forms a thin layer on the exposed surface of the semiconductor die. The method and system further comprise applying power to the circuit and determining where a portion of the liquid has moved away from an exposed portion of the surface of the die.

According to the system and method disclosed herein, the present invention allows detection of certain faults in a circuit on a semiconductor die without destroying the circuit, thereby increasing overall system performance.

DETAILED DESCRIPTION OF THE INVENTION

The present invention relates to an improvement in detecting faults in semiconductor circuits. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
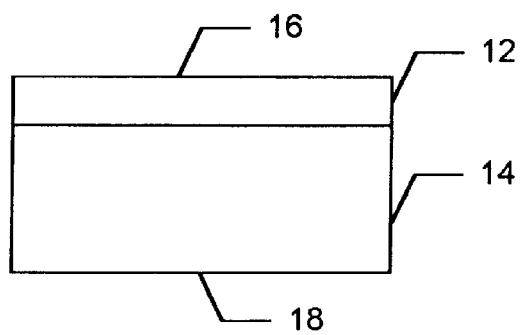
FIG. 1 is a block diagram of a semiconductor die including circuitry.

FIG. 1 is a block diagram of a conventional semiconductor die 10. Typically, the semiconductor used is silicon. The die 10 includes an active area 12 in which circuits (not shown) are formed. The top surface 16 of the active area 12 is typically considered the top of the die 10. The die 10 also includes a second portion 14 (inactive area) having a back surface 18. The inactive area 14 is significantly thicker than the active 12 in which the circuits are formed. Typically, the active area 12 is between approximately five and fifteen microns thick. The inactive area 14 is typically several hundred microns thick.

Figure 2:
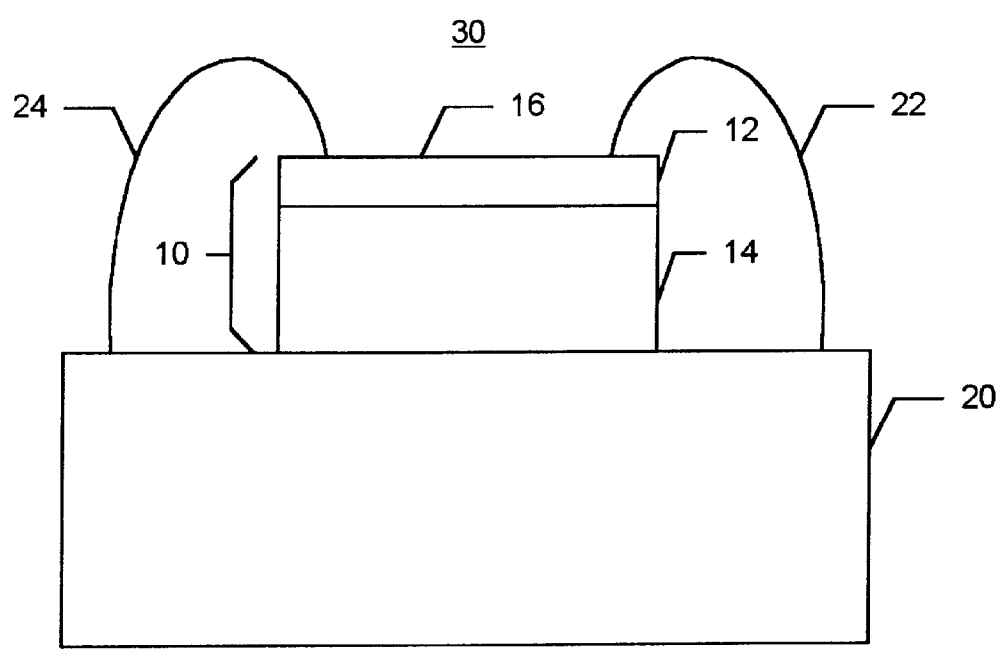
FIG. 2 is a block diagram depicting the semiconductor die mounted in a conventional package.

The die 10 is mounted on a substrate to provide a semiconductor package. FIG. 2 depicts one type of semiconductor package, a conventional package 30. The conventional package 30 includes a die 10 mounted on a substrate 20. The die 10 is mounted so that the active area 12 and top surface 16 are face up, away from the substrate 20. The bottom surface 18 and the inactive area 14 are in proximity to the substrate 20. Bond wires 22 and 24 electrically connected the circuits in the active area 12 of the die 10 to the wiring in the substrate 20.

Figure 3:
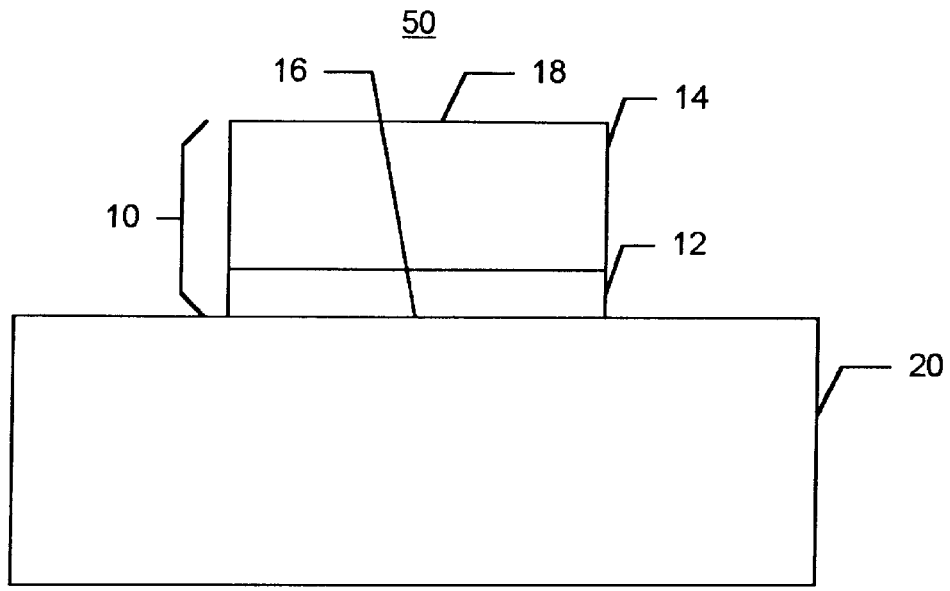
FIG. 3 is a block diagram of a flip-chip package.

FIG. 3 depicts another type of semiconductor package, a flip-chip package 50. In the flip-chip package, the die 10 is mounted with the active area 12 and top surface 16 down, in proximity to the substrate 20. Flip-chip packages are increasingly used for high speed applications, such as certain microprocessors. Electrical contact to circuits in the active area 12 of the die 10 is made through the substrate 20. Thus, the back surface 18 is face-up and readily accessible.

It is often desirable to examine the conventional package 30 and the flip-chip package 50 for faults such as junction shorts, metal shorts, or junction breakdowns in the circuits on the die 10. Typically these faults generate heat during operation of the circuits on the die 10. For example, it is believed that in the immediate area of a short, the local temperature may be as high as 200 degrees Celsius, or higher. These faults should be detected without destroying the circuits. In addition to detecting the existence of such faults within the circuits, the location of the faults should be determined.

Figure 4:
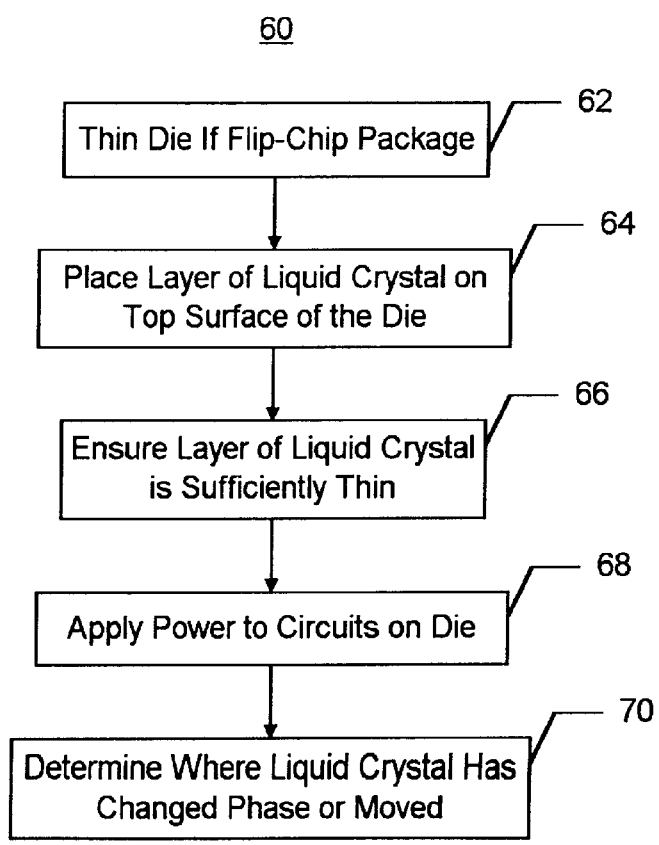
FIG. 4 is a flow chart of a conventional method for detecting certain faults in a conventional package.

FIG. 4 is a flow chart depicting a conventional method 60 for detecting faults in circuits in the conventional package 30 or in the flip-chip package 50. The conventional method uses liquid crystals to detect heat generated by the faults. If a flip-chip package 50 is being investigated, then the inactive area 14 of the die 10 is thinned, via step 62. Step 62 allows the liquid crystal to be closer to the fault generating heat. Note, however, that even when the die is thinned, the conventional liquid crystal detection does not detect faults which are relatively deeply buried. A layer of a liquid crystal (not shown) is placed on the top surface of the die 10 via step 64. In step 64, the liquid crystal is placed on the surface 16 for the conventional package 30 or on a surface of the inactive area 14 exposed by thinning of the inactive area 14 for the flip-chip package 50. In either case, the liquid crystal is in proximity to the circuits in the active area 12 of the die 10. The liquid crystal should also wet the entire area of the die 10 above the circuits.

In order to ensure that the liquid crystal will function adequately, the layer of liquid crystal must be sufficiently thin. Thus, via step 66, it is ensured that the liquid crystal is thin enough to allow for fault detection. Step 66 requires precise measurement of the thickness of liquid crystal. Typically, step 66 is performed using the interference of light. Light is shined on the liquid crystal. The liquid crystal is determined to have the correct thickness when a particular rainbow effect can be seen in the liquid crystal. The rainbow is due to the interference of light transmitted by the liquid crystal and reflected off of the semiconductor die 10. Once the liquid crystal has the correct thickness, power is applied to the circuits in the active area 12, via step 68. Faults such as shorts or a junction breakdown will generate heat when power is applied to them. The liquid crystal may undergo a phase transition over hot spots, portions of the circuit in the immediate vicinity of the faults. The phase transition causes the liquid crystal over the portions of the circuit in which faults exist to change color. Alternatively, the heat generated by shorts could cause the liquid crystal to move way from the hot spots. Thus, it is determined via step 70 where the liquid crystal has changed phase or moved. By determining where the liquid crystal has changed phase or moved, the existence and location of faults can be determined.

Although the method 60 can detect faults in conventional packages, those with ordinary skill in the art will realize that the method 60 has several drawbacks. The step 66 of ensuring that the liquid crystal has the proper thickness is relatively difficult to perform. This makes detection of faults relatively time consuming and difficult. Moreover, liquid crystals are expensive. For example, a bottle of liquid crystal may cost fifty dollars or more. Liquid crystals are also carcinogenic. Consequently, liquid crystals are dangerous to the health of scientists utilizing the conventional method 60.

The present invention provides for a method and system for detecting heat-generating faults in circuits in a semiconductor package. The present invention will be described in terms of a particular number and type of faults. However, one of ordinary skill in the art will readily recognize that this method and system will operate effectively for other types and other numbers of faults which generate heat. In addition, the method will be described in terms of a particular liquid and imaging system used in detecting faults. One of ordinary skill in the art will, however, readily recognize that the method and system function effectively for other materials having adequate properties and other imaging systems.

The present invention provides a system and method for detecting a fault in a circuit of a semiconductor package. The semiconductor package includes a die having an active area and a substrate. The circuit is located on the active area the die. The method and system comprise applying a liquid having a relatively low smoke point and which moves readily with respect to the semiconductor die to a surface of the semiconductor die. The liquid forms a thin layer on the exposed surface of the semiconductor die. The method and system further comprise applying power to the circuit and determining where a portion of the liquid has moved away from an exposed portion of the surface of the die.

Figure 5:
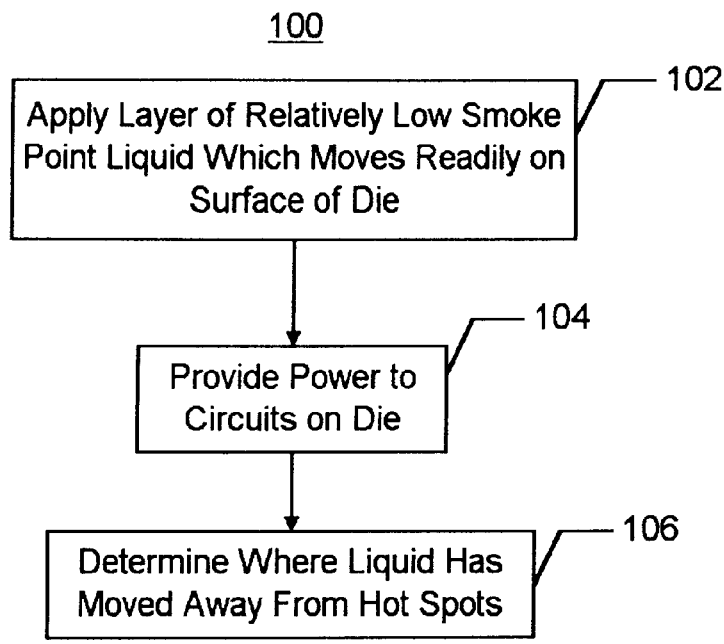
FIG. 5 is a high level flow chart a method for detecting certain faults without destroying the circuit.

To more particularly illustrate the method and system in accordance with the present invention, refer now to FIG. 5 depicting a high level flow chart of one embodiment of a method 100 for detecting faults in accordance with the present invention. A liquid having a relatively low smoke point and which moves readily on the surface 16 or 18 of the die 10, or in the case of flip chips on the surface 18 of the package 50, is applied to the surface of the die 10, via step 102. The smoke point of oil is a temperature at which the oil smokes and may burn. In a preferred embodiment, the liquid is peanut oil having a smoke point on the order of between four hundred and four hundred twenty-five degrees Fahrenheit. A relatively low smoke point is desired because an oil having an extremely high a smoke point may be too insensitive to temperature to detect shorts. If the smoke point is even lower than that of peanut oil, then the oil may burn. However, the oil should still be capable of detecting shorts. Consequently, oils having a smoke point in the range of or lower than the smoke point of peanut oil should function. It should also be noted that peanut oil is typically considered to have a high smoke point relative to other cooking oils. However, it is believed that other types of oils not used in cooking, such as motor oils, have a smoke point significantly higher than peanut oil. Consequently, in the context of this application, peanut oil is considered to have a relatively low smoke point.

Power is applied to the circuits in the die 10 via step 104. Heat generated by shorts causes the relatively low smoke point liquid to move away from the regions of the shorts. Thus, areas where the liquid has moved away to expose a portion of the die 10 are detected, via step 106. These areas indicate the existence and location of faults in the circuits which generate heat.

Because the liquid applied in step 102 has a relatively low smoke point and moves readily-on the surface of the die 10, the liquid moves away from the vicinity of shorts. Thus, shorts can be detected using the method 100. In addition, the liquid used, such as peanut oil, is very inexpensive, costing only a few dollars per bottle. The liquid is also not carcinogenic. Consequently, the health of scientists employing the method 100 is not endangered.

Figure 6:
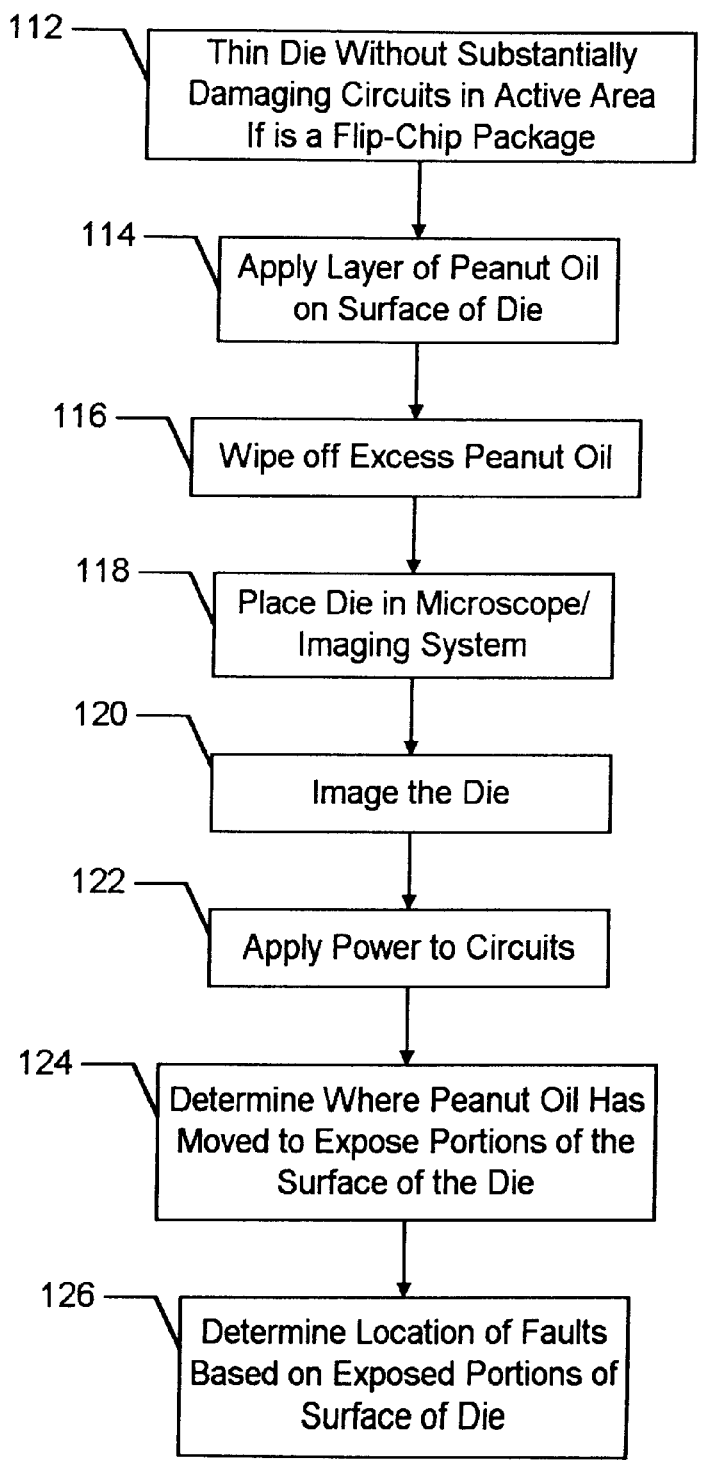
FIG. 6 depicts a more detailed flow chart of a method for detecting certain faults without destroying the circuit.

FIG. 6 depicts a more detailed flow chart of a method 110 for detecting faults in circuits of the semiconductor die 10 in accordance with the present invention. If the semiconductor package being tested in a flip-chip package 50, the inactive area 18 of the die 10 is thinned without substantially damaging the circuits in the active area, via step 112. In one embodiment, the inactive area is thinned to on the order of eighty to one hundred microns. A layer of peanut oil is then applied to a surface of the die 10, via step 114. For the flip-chip package 50, the peanut oil is applied to a surface of the inactive area 14 that has been exposed during thinning in step 112. For the conventional package, peanut oil is applied to the top surface 16. Any excess oil may then be wiped off, via step 116. Thus, a very thin layer of peanut oil will be left on the surface of the die 10.

The die 10, which is still in the flip-chip package 50 or the conventional package 30, is placed under a microscope or other imaging tool, via step 118. In a preferred embodiment, the imaging tool includes a video camera. Power is provided to the circuits on the die 10, via step 120. Faults, such as junction or metal shorts, which generate heat raise the temperature of the die 10 locally. Thus, the shorts may cause a portion of the peanut oil to move away from areas of the short.

The die 10 is imaged so that the peanut oil can be detected, via step 122. In a preferred embodiment, step 122 includes imaging the surface of the die having the peanut oil so that the peanut oil can be seen on the video camera. It is then determined where the peanut oil has moved to expose portions of the surface of the die 10, via step 124. In a preferred embodiment, step 124 includes reviewing images captured by the video camera to determine where portions of the surface of the die 10 have been exposed. These exposed portions are in the vicinity of the faults. The location of the faults can then be determined from the exposed areas, via step 126. For example, it can be assumed that a fault is located at the center of the corresponding exposed portion. The fault can then be located by determining the central area of the exposed portions. Thus, by reviewing the images captured by the video camera, the locations of the faults can be determined.

Figure 7:
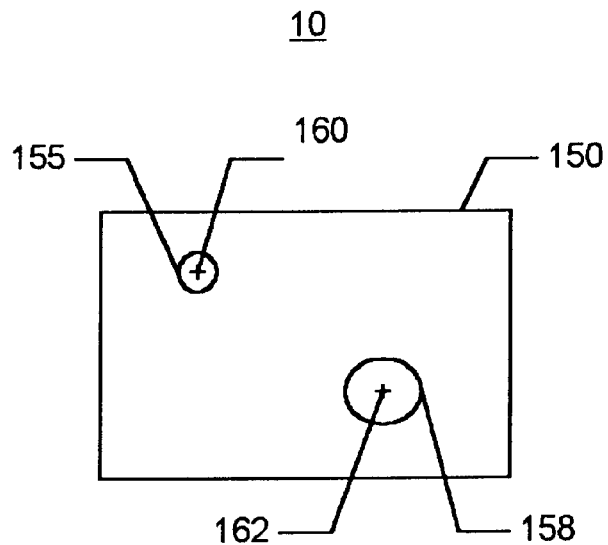
FIG.7 is a block diagram of a plan view the flip-chip package during detection of faults in accordance with the present invention.

Refer now to FIG. 7 which depicts a plan view and a side view of the die 10 during the method 110 or 100. The die 10 has a layer 150 of peanut oil on its surface. A portion of the layer 150 of oil has moved away from the vicinity of the short, exposing areas 155 and 158. In order to locate the position of the faults, the centers 160 and 162 of the circular areas 155 and 158 are determined. The faults (not shown in FIG. 7) lie approximately below the centers of the areas 155 and 158. Consequently, the areas 155 and 158 are imaged in step 124 of the method 110, and the locations of the faults determined.

As discussed with respect to the method 100, because the liquid used in the method 110 has a relatively low smoke point and moves readily on the surface of the die 10, the liquid moves away from the vicinity of shorts. Thus, shorts can be detected using the method 110. In addition, the liquid used, such as peanut oil, is very inexpensive, costing only a few dollars per bottle. The liquid is also not carcinogenic. Consequently, the health of scientists employing the method 100 is not endangered. Moreover, the thickness of the oil is easily controlled, by merely wiping away the excess in step 116. Thus, the method 110 is significantly simpler than the conventional method 60 utilizing liquid crystals.

A method and system has been disclosed for detecting faults in circuits in a die of a semiconductor package. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for detecting a fault in a circuit of a semiconductor package, the semiconductor package including a die having an active area and a substrate, the circuit being located on the active area of the die, the method comprising the steps of:

(a) applying a liquid having a relatively low smoke point and which moves readily with respect to the semiconductor die to a surface of the semiconductor die, the liquid forming a thin layer on the surface of the semiconductor die;

(b) applying power to the circuit; and (c) determining where a portion of the liquid has moved away from a portion of the surface of the die to expose the portion of the surface of the die, thereby determining an exposed portion of the surface of the die.

2. The method of claim 1 wherein the liquid is peanut oil.

3. The method of claim 2 wherein the liquid applying step (a) further includes the steps of:

(a1) pouring the peanut oil on the surface of the die; and (a2) wiping an excess portion of the peanut oil from the surface of the die.

4. The method of claim 2 wherein the semiconductor packages is a flip chip package, the method further comprising the step of:

(d) thinning a portion of the die, the portion of the die being distinct from the active area.

5. The method of claim 2 wherein the determining step (c) further comprises the step of:

(c1) imaging the die to identify the exposed portion of the surface.

6. The method of claim 5 wherein the determining step (c) further comprises the step of:

(c2) identifying a center of the exposed portion of the surface to determine the at least one location of the at least one fault.

7. A system for detecting a fault in a circuit of a semiconductor package, the semiconductor package including a die having an active area and a substrate, the circuit being located on the active area the die, the system comprising:

means for applying a liquid having a relatively low smoke point and which moves readily with respect to the semiconductor die to a surface of the semiconductor die, the liquid forming a thin layer on the surface of the semiconductor die;

means for applying power to the circuit; and means for determining where a portion of the liquid has moved away from a portion of the surface of the die to expose the portion of the surface of the die, thereby determining an exposed portion of the surface of the die.

8. The system of claim 7 wherein the liquid is peanut oil.

9. The system of claim 8 wherein the semiconductor packages is a flip chip package, the system further comprising:

means for thinning a portion of the die, the portion of the die being distinct from the active area.

10. The system of claim 8 wherein the determining means further comprises:

means for imaging the die to identify the exposed portion of the surface.

11. The system of claim 10 wherein the determining means further comprises:
   means for identify a center of the exposed portion of the surface to determine the at least one location of the at least one fault.

12. The system of claim 11 wherein the imaging means further comprise:
   a video camera coupled with a microscope.

* * * * *